United States Patent [19]
Scott et al.

[11] Patent Number: 6,163,687
[45] Date of Patent: Dec. 19, 2000

[54] TUNING MODULE FOR A DUAL FREQUENCY PLL SYNTHESIZED TUNER

[75] Inventors: Stephen A. Scott, Phoenix; Nam Dang, Chandler, both of Ariz.

[73] Assignee: Intel Corporation, Santa Clara, Calif.

[21] Appl. No.: 08/898,543

[22] Filed: Jul. 22, 1997

[51] Int. Cl.[7] .............................. H04B 1/26; H04B 17/00; H04B 1/18

[52] U.S. Cl. ................... 455/316; 455/182.1; 455/192.1; 455/255; 455/67.3

[58] Field of Search ..................................... 455/256, 257, 455/258, 259, 260, 314, 316, 192.2, 192.1, 182.1, 182.2, 255, 226.3, 265, 67.6, 503, FOR 109; 375/344; 331/2

[56] References Cited

U.S. PATENT DOCUMENTS

| | | | |
|---|---|---|---|
| 4,339,826 | 7/1982 | Ogita et al. | 455/183.2 |
| 4,397,038 | 8/1983 | Rzeszewski | 455/183.2 |
| 4,545,072 | 10/1985 | Skutta et al. | 455/183.2 |
| 4,581,643 | 4/1986 | Carlson | 348/731 |
| 4,727,581 | 2/1988 | Manlove | 455/182.2 |
| 4,817,195 | 3/1989 | Kubo et al. | 455/192.2 |
| 4,932,072 | 6/1990 | Toko | 455/76 |
| 5,107,522 | 4/1992 | Kitayama et al. | 375/344 |
| 5,179,729 | 1/1993 | Mishima et al. | 455/260 |
| 5,361,407 | 11/1994 | Sawada et al. | 455/209 |
| 5,388,125 | 2/1995 | Toda et al. | 375/332 |
| 5,483,686 | 1/1996 | Saka et al. | 455/182.2 |
| 5,752,174 | 5/1998 | Matai et al. | 455/183.1 |

FOREIGN PATENT DOCUMENTS 0678974  10/1995   European Pat. Off. ......... H03D 7/16

*Primary Examiner*—Reinhard J. Eisenzopf
*Assistant Examiner*—Charles N. Appiah
*Attorney, Agent, or Firm*—Kenyon & Kenyon

[57] ABSTRACT

A tuning module tunes a dual frequency PLL synthesized tuner to a desired channel frequency. The dual frequency PLL synthesized tuner includes a first PLL and a second PLL. The tuning module receives a carrier-to-noise ratio ("CNR") for each of one or more signals output from the dual frequency PLL synthesized tuner. The tuning module then generates first PLL parameters and second PLL parameters based on the CNRs and the desired channel frequency. Finally, the tuning module programs the first PLL with the first PLL parameters and programs the second PLL with the second PLL parameters.

17 Claims, 3 Drawing Sheets

TUNING MODULE FOR A DUAL FREQUENCY PLL SYNTHESIZED TUNER

BACKGROUND OF THE INVENTION

The present invention is directed to a tuning module. More particularly, the present invention is directed to a tuning module that operates a dual frequency phase-locked loop synthesized tuner.

A dual frequency phase-locked loop ("PLL") synthesized tuner is a well-known device that is used to convert high-frequency signals to low-frequency signals. Dual frequency PLL synthesized tuners typically include an upconverter and a downconverter, and are implemented in, for example, cable television receivers and satellite communication receivers.

Typical dual frequency PLL synthesized tuners operate by setting local oscillators, which are generated by PLLs, to the frequencies required by the upconverter and the downconverter. However, the carrier-to-noise ratio ("CNR") of the output of these tuners is frequently degraded due to a variety of problems. One problem is frequency offset, which can be caused by external and internal variations in component tolerances and calibration. Another problem is internal and external interference. Internal interference can be caused by internal sources such as mixing products from local oscillators, digital switching noise, and harmonics from clocks. External interference can be caused by external sources such as radiated or conducted sources of radio frequency ("RF").

Degraded carrier-to-noise ratio can be avoided by performing a different type of adjustment to the tuner for each type of problem. However, known dual frequency PLL synthesized tuners do not permit individual adjustments of each PLL; most known tuners adjust only a single PLL, and this adjustment is based on only the frequency of a desired channel. Therefore known dual frequency PLL synthesized tuners do not adequately compensate for frequency offset and interference problems that degrade the carrier-to-noise ratio.

Based on the foregoing, there is a need for a tuning module that operates a dual frequency PLL synthesized tuner to optimize the carrier-to-noise ratio of the output.

SUMMARY OF THE INVENTION

One embodiment of the present invention is a tuning module that tunes a dual frequency PLL synthesized tuner to a desired channel frequency. The dual frequency PLL synthesized tuner includes a first PLL and a second PLL.

The tuning module receives a carrier-to-noise ratio ("CNR") for each of one or more signals output from the dual frequency PLL synthesized tuner. The tuning module then generates at least one first PLL parameter and at least one second PLL parameter based on the CNRs and the desired channel frequency. The tuning module then programs the first PLL with the at least one first PLL parameter and programs the second PLL with the at least one second PLL parameter.

DETAILED DESCRIPTION

One embodiment of the present invention is a tuning module that is coupled to a dual frequency PLL synthesized tuner (a "PLL tuner"). Another embodiment of the present invention is a tuning device that includes the PLL tuner and the tuning module.

Figure 1:
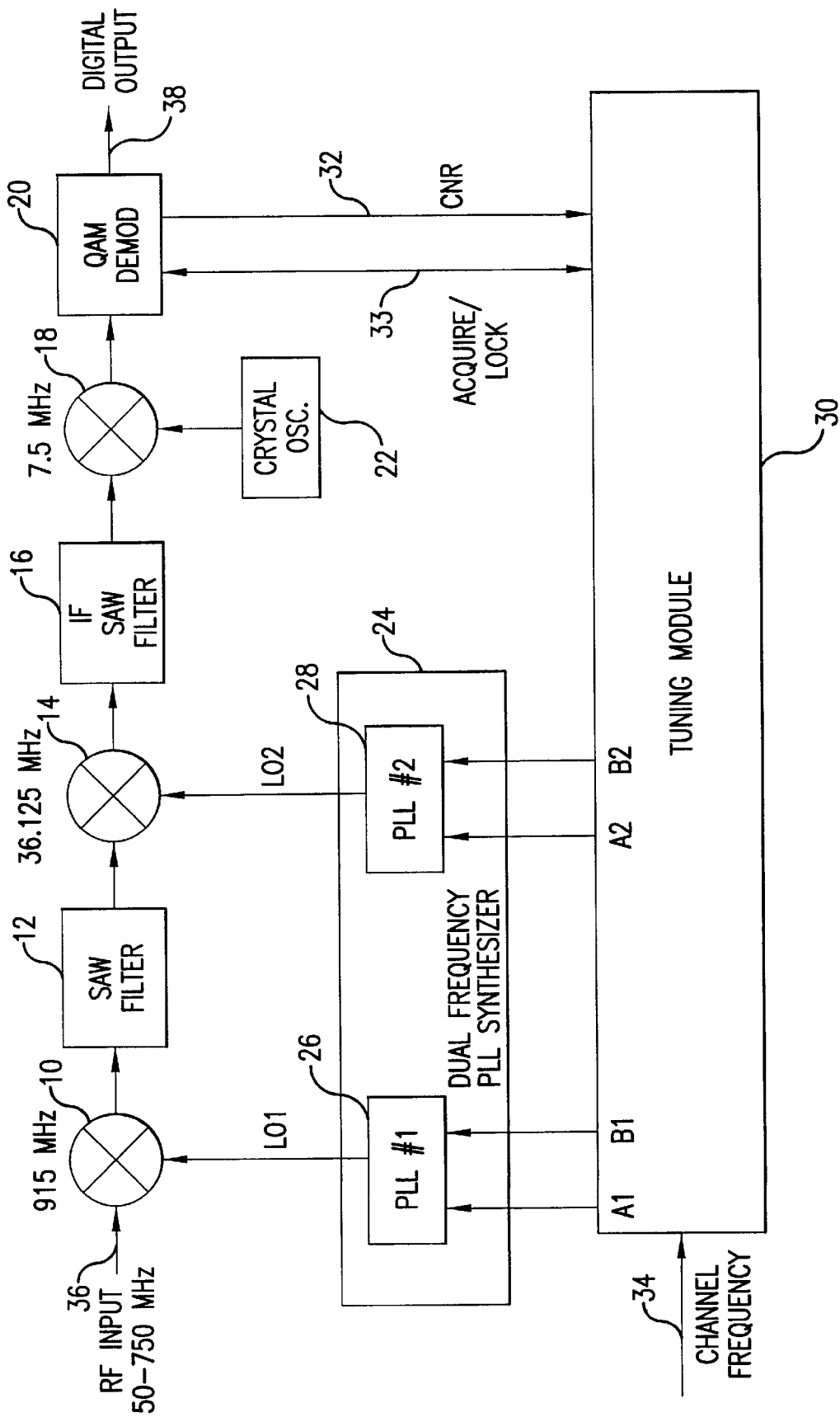
FIG. 1 illustrates an example of a PLL tuner coupled to the tuning module in accordance with one embodiment of the present invention.

FIG. 1 illustrates an example of a PLL tuner coupled to the tuning module in accordance with one embodiment of the present invention. The PLL tuner includes a mixer 10 that functions as an upconverter, and mixers 14, 18 that function as downconverters. Mixer 10 converts a radio frequency ("RF") input 36 of 50–750 MHz to a fixed frequency of 915 MHz. In one embodiment, RF input 36 is digital data received from a coaxial cable in a cable modem system. In this embodiment, the digital data includes a plurality of data "channels" that are transmitted on an RF carrier. A 915 MHz surface-acoustic-wave ("SAW") filter 12 is coupled to mixer 10 and rejects channel images and other unwanted signals output from mixer 10.

Mixer 14 is coupled to the output of SAW filter 12 and converts a desired data channel centered at 915 megahertz to a fixed intermediate frequency ("IF") of 36.125 MHz. The output of mixer 14 is coupled to a 36.125 MHz IF SAW filter 16 which rejects adjacent channels.

Mixer 18 is coupled to IF SAW filter 16 and converts the IF frequency signal to 7.5 MHz. Mixer 18 receives a constant reference frequency input of 28.322 Mhz from a crystal oscillator 22. The output of mixer 18, which is the output of the PLL tuner, is sent to a quadrature amplitude modulator ("QAM") demodulator 20 which generates a digital output 38. QAM demodulator 20 also includes a known function of outputting a CNR signal 32 that indicates the carrier-to-noise ratio of the signal output from the PLL tuner.

The PLL tuner further includes a dual frequency PLL synthesizer 24. The dual frequency PLL synthesizer 24 generates a local oscillator input ("LO1") to mixer 10 from a PLL 26, and a local oscillator input ("LO2") to mixer 14 from a PLL 28. Each PLL 26, 28 includes an "A counter", commonly referred to as a "pulse swallow counter", and a "B counter", commonly referred to as a "programmable counter." The A and B counters are registers that are programmed with external data. The counters control the output frequencies of PLL 26 and PLL 28 (LO1 and LO2, respectively). Each PLL 26, 28 also includes an "R counter", commonly referred to as a "programmable reference divider", and a prescaler that determines the size of the steps of PLL 26 and 28. In one embodiment of the present invention, dual frequency PLL synthesizer 24 is the LMX2336 PLLatinum™ Dual Frequency Synthesizer from National Semiconductor Corp. The LMX2336 includes a 7-bit A counter and an 11-bit programmable counter.

Tuning module 30 is coupled to PLL 26 and 28 and provides PLL parameters A1 and B1 to the input of the A and B counters of PLL 26 and PLL parameter A2 and B2 to the A and B counters of PLL 28. Therefore, the output of tuning module 30 programs PLL 26 and 28 so that the desired local oscillator signals are generated and output to mixers 10 and 14, respectively. Tuning module 30 receives as inputs CNR signal 32 provided by QAM demodulator 20, and a desired channel frequency 34. The desired channel frequency is the frequency of the RF signal that contains the desired modulated digital data. The desired channel frequency is input from an external source, e.g., a channel selector. Further, tuning module 30 can output an "acquire" command to QAM demodulator 20 via path 33. The acquire command instructs QAM demodulator 20 to attempt to lock-on to its received signal. When the received signal is locked-on, QAM demodulator 20 outputs a "locked-on" signal to tuning module 30, also via path 33.

Figure 2:
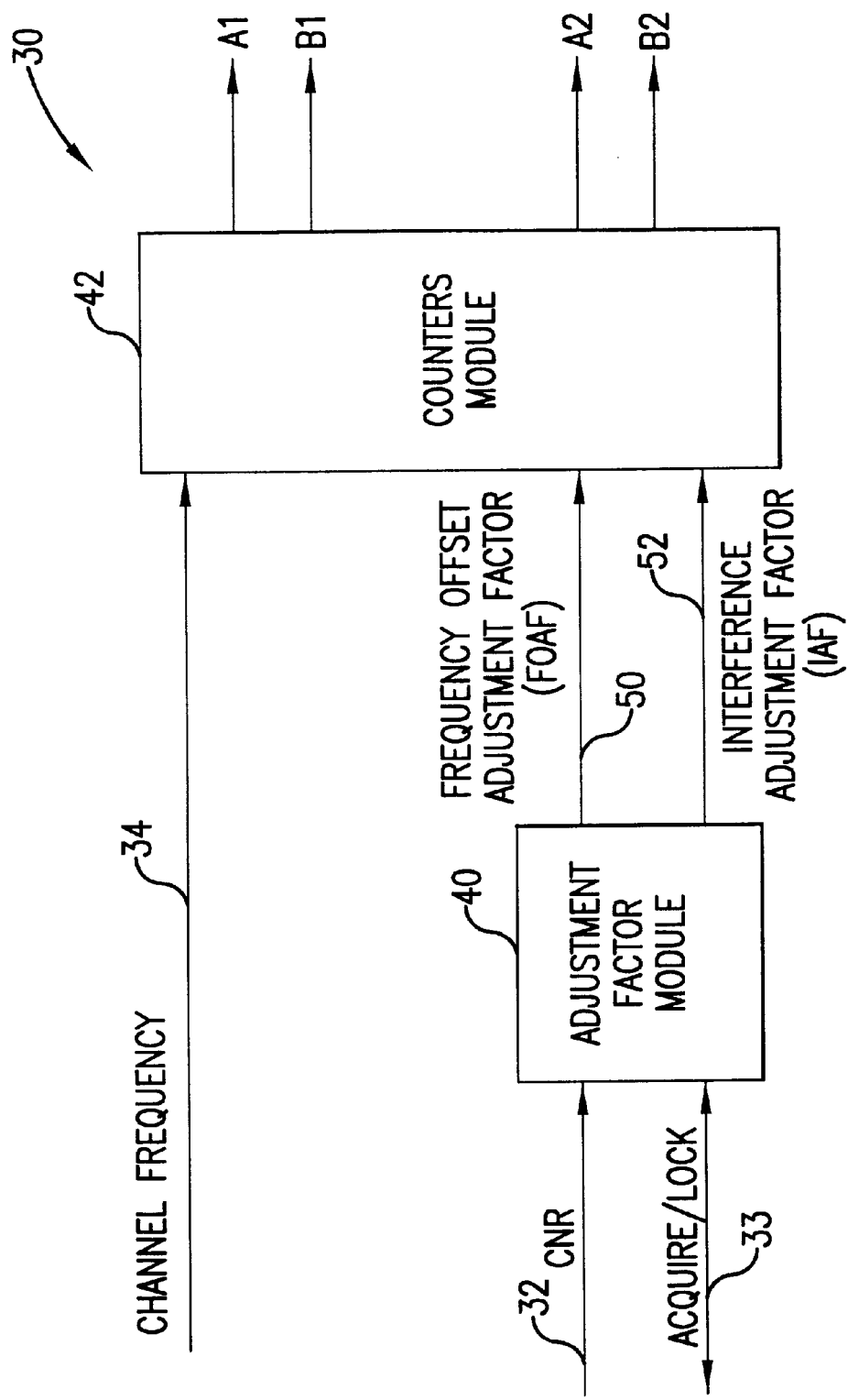
FIG. 2 is a block diagram illustrating in more detail the tuning module.

FIG. 2 is a block diagram illustrating in more detail tuning module 30. Tuning module 30 includes an adjustment factor module 40 and a counters module 42. Adjustment factor module 40 determines and outputs a frequency offset adjustment factor ("FOAF") via path 50 and an interference adjustment factor ("IAF") via path 52 based on an input of CNR signal 32. Counters module 42 is coupled to adjustment factor module 40 and outputs A1, B1, A2 and B2 based on inputs of channel frequency 34, FOAF ard IAF. Both adjustment factor module 40 and counters module 42 in one embodiment are implemented in software on a general purpose computer that includes a processor and a storage device. However, adjustment factor module 40 and counters module 42 can be implemented with any combination of computer hardware and software.

Counters module 42 determines A1, B1, A2 and B2 using the following equations:

$$B1=(BO1+(IAF\times 1\ MHz))/((XTAL/R1)\times PRE1);$$

$$A1=((BO1+(IAF\times 1\ MHz))+CHAN)/(XTAL/R1))-(PRE1\times B1);$$

$$B2=(BO2+(IAF\times 1\ MHz))/((XTAL/R2)\times PRE2);$$

and $$A2=(((BO2+(IAF\times 1\ MHz))/(XTAL/R2))-(PRE2\times B2))+FOAF.$$

In the above equations, BO1 is the upconverter frequency of mixer 10 (e.g., 915 MHz), BO2 is BO1 plus the downconverter frequency of mixer 14 (e.g, 915+36.125, or 951.125 MHz), XTAL is the reference frequency of crystal oscillator 22 (e.g., 28.322 MHz), R1 and R2 are the values of the R counters of PLL 26 and PLL 28, respectively (in one embodiment, both R1 and R2 equal 226), PRE1 and PRE2 are the values of the prescaler of PLL 26 and PLL 28, respectively (in one embodiment, both PRE1 and PRE2 equal 64) and CHAN is the desired channel frequency 34. The values of A1, B1, A2 and B2 must be positive integers because they are input to dual frequency PLL synthesizer 24 as a serial binary bit stream. Therefore, the values of A1, B1, A2 and B2 are truncated to an integer.

Figure 3:
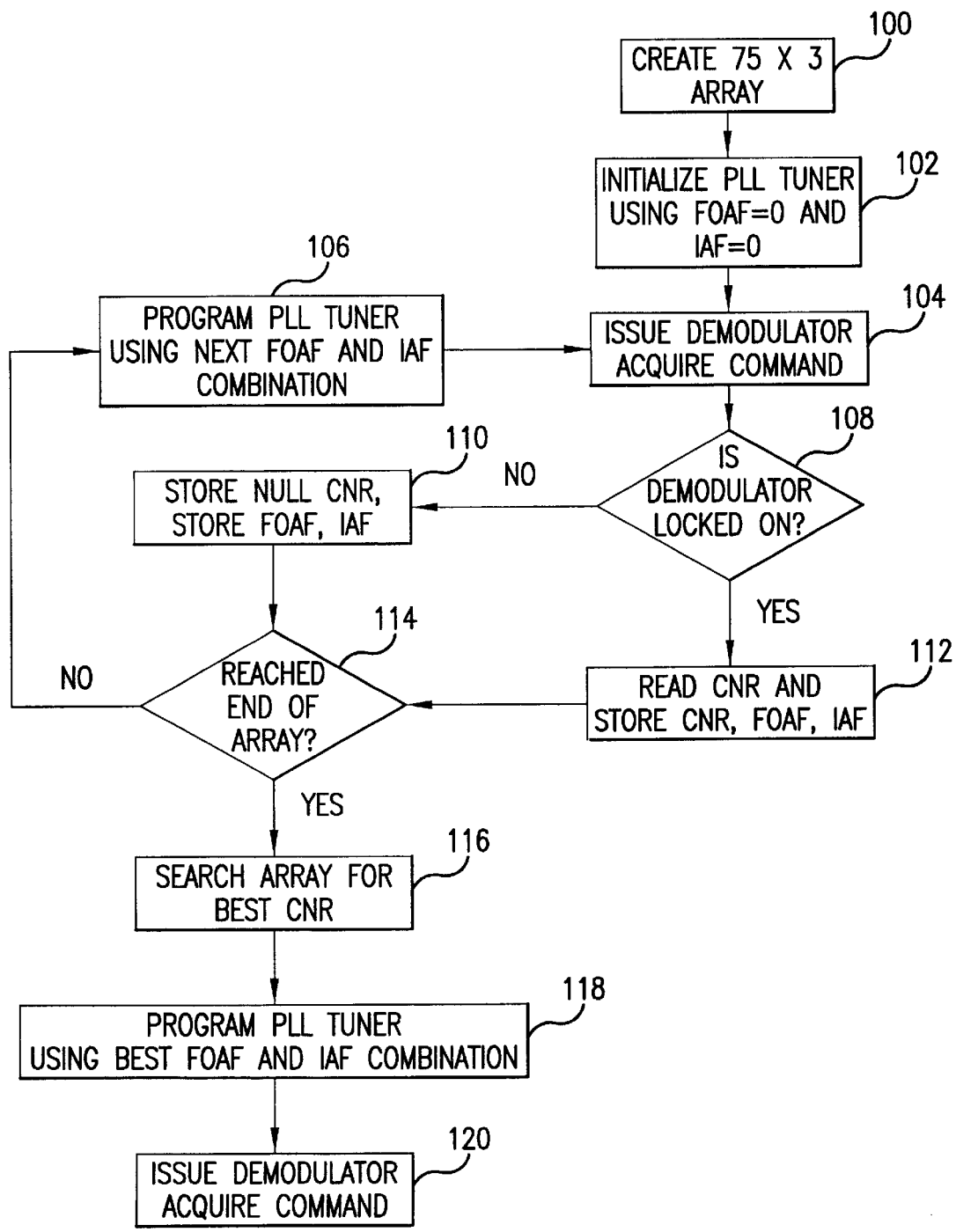
FIG. 3 is a flowchart illustrating the steps performed by an adjustment factor module in the tuning module.

FIG. 3 is a flowchart illustrating the steps performed by adjustment factor module 40 to generate FOAF and IAF. In one embodiment, FOAF is an integer within the following range: $-2 \leq FOAF \leq 2$. Similarly, IAF is an integer within the following range: $-7 \leq IAF \leq 7$.

At step 100, a 75×3 array is created. The array stores all possible combinations of FOAF and IAF values, and a corresponding CNR for each combination.

At step 102, the PLL tuner is initialized by setting FOAF=0 and IAF=0, and programming PLL 26 and PLL 28 with the outputs of counters module 42.

At step 104, an "acquire" command is; issued to QAM demodulator 20 via path 33. At step 108, it is determined whether QAM demodulator 20 has locked-on to its received signal. If the signal has been locked-on at 108, at step 112 the CNR for that signal is read and the CNR, FOAF, and IAF is stored in the array (when step 112 is initially executed, FOAF and IAF equal 0). However, if at step 108 QAM demodulator 20 is not able to lock-on to the signal, at step 110 a null value for CNR is stored in the array along with the FOAF and IAF.

At step 114, it is determined whether the end of the array has been reached. The end of the array is reached when all combinations of FOAF and IAF (i.e., 75 combinations) have been attempted. If the end of the array has not been reached at step 114, at step 106 the PLL tuner is programmed using the next FOAF and IAF combination. The acquire command is then issued again for QAM demodulator 20 at step 104.

If at step 114 the end of the array has been reached, at step 116 the array is searched for the best CNR. At step 118 the FOAF and IAF combination that resulted in the best CNR is used to program the PLL tuner. Then, this FOAF and IAF combination is sent to counters module 42 which outputs PLL parameters (i.e., A1, B1, A2 and B2) in accordance with the equations described above. The PLL parameters program PLL 26 and PLL 28.

Finally, at step 120 the acquire command is issued for the QAM demodulator 20 and the optimized signal is locked-on.

As described, the combination of the tuning module and the dual frequency PLL synthesized tuner in accordance with the present invention enables a channel to be tuned with an optimal CNR. The described method of tuning compensates for problems such as frequency offset, internal interference and external interference by individually controlling each PLL based on the CNR of the output signal.

Several embodiments of the present invention are specifically illustrated and/or described herein. However, it will be appreciated that modifications and variations of the present invention are covered by the above teachings and within the purview of the appended claims without departing from the spirit and intended scope of the invention.

What is claimed is:

1. A method of tuning to a desired channel frequency a dual frequency phase-locked loop (PLL) synthesized tuner that includes a first PLL and a second PLL, said method comprising the steps of:

(a) receiving a carrier-to-noise ratio (CNR) for each of one or more signals output from the dual frequency PLL synthesized tuner;

(b) generating at least one first PLL parameter and at least one second PLL parameter based on the at least one CNR and the desired channel frequency, said generating step comprising the steps of:

(b-1) generating a frequency offset adjustment factor (FOAF) and an interference adjustment factor (IAF) at an adjustment factor module based on the CNR; and (b-2) generating the first and second PLL parameters at a counters module based on the FOAF, the IAF, and the desired channel frequency; and (c) programming the first PLL with the at least one first PLL parameter and the second PLL with the at least one second PLL parameter.

2. The method of claim 1, wherein the dual frequency PLL synthesized tuner includes an upconverter, a first downconverter and a second downconverter coupled to a reference frequency (XTAL), and wherein the first PLL has a first R counter value (R1) and a first prescaler value (PRE1), wherein step (b) further comprises the steps of:

(b-3) generating a first B counter value using substantially the following equation:

$$\text{first B counter value}=(BO1+(IAF\times 1\ MHz))/((XTAL/R1)\times PRE1);$$

and (b-4) generating a first A counter value using substantially the following equation:

$$\text{first A counter value} = ((BO1+(IAF \times 1 \text{ MHz}))+CHAN)/(XTAL/R1))-\\(PRE1 \times (\text{first B counter value}));$$

wherein BO1 equals a frequency of the upconverter.

3. The method of claim 2, wherein the second PLL has a second R counter value (R2) and a second prescaler value (PRE2) and step (b) further comprises the steps of:

(b-5) generating a second B counter value using substantially the following equation:

$$\text{second B counter value} = (BO2+(IAF \times 1 \text{ MHz}))/((XTAL/R2) \times PRE2);$$

and (b-6) generating a second A counter value using substantially the following equation:

$$\text{second A counter value} = (((BO2+(IAF \times 1 \text{ MHz}))/(XTAL/R2))-\\(PRE2 \times B2))+FOAF;$$

wherein BO2 equals BO1 plus a frequency of the first downconverter.

4. The method of claim 3, wherein step (c) comprises the steps of:

(c-1) inputting the first A counter value to an A counter of the first PLL and the first B counter value to a B counter of the first PLL; and (c-2) inputting the second A counter value to an A counter of the second PLL and the second B counter value to a B counter of the second PLL.

5. The method of claim 1, wherein the FOAF and the IAF are generated by the steps of:

determining all possible combinations of FOAF and IAF;

for each combination of FOAF and IAF, programming the first PLL and the second PLL and receiving the CNR;

determining a best CNR; and selecting the combination of FOAF and IAF that corresponds to the best CNR.

6. A tuning module for a tuning device which includes a dual frequency phase locked-loop (PLL) synthesized tuner that outputs a signal at a desired channel frequency and a demodulator to which the signal is coupled and that outputs a carrier-to-noise ratio (CNR) for the signal, wherein the dual frequency PLL synthesized tuner includes a first PLL and a second PLL, said tuning module comprising:

an adjustment factor module coupled to the CNR output, wherein said adjustment factor module generates a frequency offset adjustment factor (FOAF) and an interference adjustment factor (IAF); and a counters module coupled to the desired channel frequency and said adjustment factor module, wherein said counters module generates at least one first PLL parameter and at least one second PLL parameter, based on the FOAF and the IAF, and programs the first PLL and the second PLL.

7. The tuning module of claim 6, wherein the dual frequency PLL tuner includes an upconverter coupled to the first PLL, a first downconverter coupled to the second PLL, and a second downconverter coupled to a reference frequency (XTAL).

8. The tuning module of claim 6, wherein the first PLL has a first R counter value (R1) and a first prescaler value (PRE1), and wherein the counters module generates the at least one first PLL parameter by generating a first B counter value using substantially the following equation:

$$\text{first B counter value} = (BO1+(IAF \times 1 \text{ MHz}))/((XTAL/R1) \times PRE1);$$

and by generating a first A counter value using substantially the following equation:

$$\text{first A counter value} = ((BO1+(IAF \times 1 \text{ MHz}))+CHAN)/(XTAL/R1))-\\(PRE1 \times (\text{first B counter value}));$$

wherein BO1 equals a frequency of the upconverter.

9. The tuning module of claim 8, wherein the second PLL has a second R counter value (R2) and a second prescaler value (PRE2) and wherein the counters module generates the at least one second PLL parameter by generating a second B counter value using substantially the following equation:

$$\text{second B counter value} = (BO2+(IAF \times 1 \text{ MHz}))/((XTAL/R2) \times PRE2);$$

and by generating a second A counter value using substantially the following equation:

$$\text{second A counter value} = (((BO2+(IAF \times 1 \text{ MHz}))/XTAL/R2))-\\(PRE2 \times B2))+FOAF;$$

wherein BO2 equals BO1 plus a frequency of the first downconverter.

10. The tuning module of claim 9, wherein said counters module is programmed to:

input the first A counter value to an A counter of the first PLL and input the first B counter value to a B counter of the first PLL; and input the second A counter value to an A counter of the second PLL and input the second B counter value to a B counter of the second PLL.

11. The tuning module of claim 6, wherein said adjustment factor module is programmed to:

determine all possible combinations of FOAF and IAF;

for each combination of FOAF and IAF, program the first PLL and the second PLL and receive the CNR;

determine a best CNR; and select the combination of FOAF and IAF that corresponds to the best CNR.

12. A tuning device comprising:

an upconverter;

a first downconverter coupled to said upconverter;

a second downconverter coupled to said first downconverter, wherein said second downconverter outputs a signal at a desired channel frequency;

a demodulator coupled to said second downconverter, wherein said demodulator receives the signal and outputs a carrier-to-noise ratio (CNR) for the signal;

a first phase locked-loop (PLL) coupled to said upconverter;

a second PLL coupled to said first downconverter;

a reference frequency (XTAL) coupled to said second downconverter; and a tuning module coupled to said first PLL and said second PLL, said tuning module comprising:

an adjustment factor module coupled to the CNR output, wherein said adjustment factor module generates a frequency offset adjustment factor (FOAF) and an interference adjustment factor (IAF); and a counters module coupled to the desired channel frequency and said adjustment factor module, wherein said counters module generates at least one first PLL parameter and at least one second PLL parameter, based on the FOAF and the IAF, and programs the first PLL and the second PLL.

13. The tuning device of claim 12, wherein said first PLL has a first R counter value (R1) and a first prescaler value (PRE1), and wherein said counters module generates the at least one first PLL parameter by generating a first B counter value using substantially the following equation:

$$\text{first B counter value} = (BO1 + (IAF \times 1 \text{ MHz}))/((XTAL/R1) \times PRE1);$$

and by generating a first A counter value using substantially the following equation:

$$\text{first A counter value} = ((BO1 + (IAF \times 1 \text{ MHz}) + CHAN)/(XTAL/R1)) - (PRE1 \times (\text{first B counter value}));$$

wherein BO1 equals a frequency of said upconverter.

14. The tuning device of claim 13, wherein said second PLL has a second R counter value (R2) and a second prescaler value (PRE2) and wherein said counters module generates the at least one second PLL parameter by generating a second B counter value using substantially the following equation:

$$\text{second B counter value} = (BO2 + (IAF \times 1 \text{ MHz}))/((XTAL/R2) \times PRE2);$$

and by generating a second A counter value using substantially the following equation:

$$\text{second A counter value} = (((BO2 + (IAF \times 1 \text{ MHz}))/(XTAL/R2)) - (PRE2 \times B2)) + FOAF;$$

wherein BO2 equals BO1 plus a frequency of the first downconverter.

15. The tuning device of claim 14, wherein said counters module is programmed to:

input the first A counter value to an A counter of said first PLL and input the first B counter value to a B counter of said first PLL; and input the second A counter value to an A counter of said second PLL and input the second B counter value to a B counter of said second PLL.

16. The tuning device of claim 15, wherein said adjustment factor module is programmed to:

determine all possible combinations of FOAF and IAF;

for each combination of FOAF and IAF, program said first PLL and said second PLL and receive the CNR;

determine a best CNR; and select the combination of FOAF and IAF that corresponds to the best CNR.

17. The tuning device of claim 12, wherein said first PLL and said second PLL form a dual frequency PLL synthesizer.

* * * * *